(12) United States Patent
Aoyama

(10) Patent No.: US 11,300,411 B2
(45) Date of Patent: Apr. 12, 2022

(54) PHYSICAL QUANTITY DETECTION CIRCUIT, PHYSICAL QUANTITY SENSOR, ELECTRONIC INSTRUMENT, VEHICLE, AND METHOD FOR DIAGNOSING FAILURE OF PHYSICAL QUANTITY SENSOR

(71) Applicant: Seiko Epson Corporation, Tokyo (JP)

(72) Inventor: Takashi Aoyama, Chino (JP)

(73) Assignee: Seiko Epson Corporation

( * ) Notice: Subject to any disclaimer, the term of this patent is extended or adjusted under 35 U.S.C. 154(b) by 92 days.

(21) Appl. No.: 16/855,073

(22) Filed: Apr. 22, 2020

(65) Prior Publication Data

US 2020/0340812 A1 Oct. 29, 2020

(30) Foreign Application Priority Data

Apr. 23, 2019 (JP) .............................. JP2019-081621

(51) Int. Cl.
 *G01C 19/5776* (2012.01)
 *H03F 3/45* (2006.01)
(52) U.S. Cl.
 CPC ............ *G01C 19/5776* (2013.01); *H03F 3/45* (2013.01)
(58) Field of Classification Search
 CPC .... G01C 19/5614; G01C 19/5776; H03F 3/45
 See application file for complete search history.

(56) References Cited

U.S. PATENT DOCUMENTS

| 2007/0261488 A1* | 11/2007 | Murashima ........ G01C 19/5607 73/504.04 |
| 2010/0071466 A1* | 3/2010 | Kanai .................... G01C 19/56 73/504.02 |
| 2010/0326189 A1 | 12/2010 | Sato et al. |

(Continued)

FOREIGN PATENT DOCUMENTS

| JP | 2003-021517 A | 1/2003 |
| JP | 2010-107416 A | 5/2010 |
| JP | 2010-286368 A | 12/2010 |

*Primary Examiner* — Francis C Gray
(74) *Attorney, Agent, or Firm* — Harness, Dickey & Pierce, P.L.C.

(57) ABSTRACT

A physical quantity detection circuit including a differential amplification circuit that differentially amplifies a signal pair based on a first signal containing a first physical quantity component and a first vibration leakage component and a second signal containing a second physical quantity component having a phase opposite the phase of the first physical quantity component and a second vibration leakage component having the same phase as the phase of the first vibration leakage component, an adder circuit that adds the signal pair, a first synchronous wave-detection circuit that performs synchronous wave-detection on a signal based on an output signal from the differential amplification circuit, a second synchronous wave-detection circuit that performs synchronous wave-detection on a signal based on an output signal from the adder circuit, a physical quantity detection signal generation circuit that generates a physical quantity detection signal based on an output signal from the first synchronous wave-detection circuit, and a vibration leakage signal (Continued)

generation circuit that generates a vibration leakage signal based on an output signal from the second synchronous wave-detection circuit.

14 Claims, 9 Drawing Sheets

(56) References Cited

U.S. PATENT DOCUMENTS

2012/0055230 A1* 3/2012 Naruse ............... G01C 19/5776
                                                                   73/1.37
2019/0094284 A1* 3/2019 Takada ............... G01C 19/5614

\* cited by examiner

PHYSICAL QUANTITY DETECTION CIRCUIT, PHYSICAL QUANTITY SENSOR, ELECTRONIC INSTRUMENT, VEHICLE, AND METHOD FOR DIAGNOSING FAILURE OF PHYSICAL QUANTITY SENSOR

The present application is based on, and claims priority from JP Application Serial Number 2019-081621, filed Apr. 23, 2019, the disclosure of which is hereby incorporated by reference herein in its entirety.

BACKGROUND

1. Technical Field

The present disclosure relates to a physical quantity detection circuit, a physical quantity sensor, an electronic instrument, a vehicle, and a method for diagnosing failure of the physical quantity sensor.

2. Related Art

At present, a physical quantity sensor capable of detecting a variety of physical quantities, such as a gyro sensor that detects angular velocity and an acceleration sensor that detects acceleration, are widely used in a variety of systems and electronic instruments. In recent years, to achieve high reliability in a system using a physical quantity sensor, an approach to diagnosis of whether or not the physical quantity sensor has failed has been proposed.

For example, JP-A-2010-107416 describes a physical quantity detection apparatus including a physical quantity detection circuit that detects leakage vibration that occurs at two detection vibration arms of a physical quantity detection device resulting from flexural vibration of two drive vibration arms and outputs signals according to the magnitudes of the leakage vibration in an abnormality diagnosis mode. Specifically, in the physical quantity detection circuit of the physical quantity detection apparatus described in JP-A-2010-107416, in a physical quantity detection mode, a differential amplification circuit differentially amplifies signals outputted from two detection electrodes of the physical quantity detection device, and a synchronous wave-detection circuit performs synchronous wave-detection on the differentially amplified signals, thereby the physical quantity detection circuit generates signals according to physical quantity components, whereas in an abnormality diagnosis mode, the differential amplification circuit and the synchronous wave-detection circuit are used to change the phases of wave-detection signals inputted to the synchronous wave-detection circuit, and signals according to vibration leakage components are outputted. When the physical quantity detection device breaks or otherwise fails, the magnitudes of the leakage vibration change, resulting in a change in the magnitude of the signal outputted from the physical quantity detection circuit in the abnormality diagnosis mode, whereby failure of the physical quantity sensor can be diagnosed based on the signal outputted from the physical quantity detection circuit.

In the physical quantity detection apparatus described in JP-A-2010-107416, however, the physical quantity detection device is so tuned that the vibration leakage components contained in the signals outputted from the two detection electrodes have opposite phases, and the output signals from the differential amplification circuit each contain the physical quantity component and the vibration leakage component that is relatively large. Therefore, in the physical quantity detection mode, when the phase of the wave-detection signal deviates from a design value due, for example, to manufacture variation, the output signal from the synchronous wave-detection circuit contains a relatively large vibration leakage component. Therefore, in the physical quantity detection mode, a noise component contained in the signal outputted from the physical quantity detection circuit increases, and a zero point that is the magnitude of the physical quantity detection signal generated when no physical quantity acts could deviate from a design value by an indefinite amount.

SUMMARY

An aspect of a physical quantity detection circuit according to the present disclosure is a physical quantity detection circuit that generates a physical quantity detection signal according to a physical quantity detected with a physical quantity detection device based on a first signal and a second signal outputted from the physical quantity detection device that detects the physical quantity, the first signal containing a first physical quantity component based on the physical quantity detected with the physical quantity detection device and a first vibration leakage component based on vibration of the physical quantity detection device, the second signal containing a second physical quantity component based on the physical quantity detected with the physical quantity detection device and a second vibration leakage component based on the vibration of the physical quantity detection device, the first and second physical quantity components having opposite phases, and the first and second vibration leakage components having the same phase, the physical quantity detection circuit including a differential amplification circuit that differentially amplifies a signal pair based on the first and second signals, an adder circuit that adds the signal pair, a first synchronous wave-detection circuit that performs synchronous wave-detection on a signal based on an output signal from the differential amplification circuit and outputs a signal according to a difference between the first physical quantity component and the second physical quantity component, a second synchronous wave-detection circuit that performs synchronous wave-detection on a signal based on an output signal from the adder circuit and outputs a signal according to a sum of the first vibration leakage component and the second vibration leakage component, a physical quantity detection signal generation circuit that generates the physical quantity detection signal based on an output signal from the first synchronous wave-detection circuit, and a vibration leakage signal generation circuit that generates a vibration leakage signal based on an output signal from the second synchronous wave-detection circuit.

In the aspect of the physical quantity detection circuit, an amount of difference between the first vibration leakage component and the second vibration leakage component may be substantially zero.

In the aspect of the physical quantity detection circuit, the physical quantity detection circuit may further include a first charge amplification circuit to which the first signal is inputted and a second charge amplification circuit to which the second signal is inputted, and the signal pair may be formed of an output signal from the first charge amplification circuit and an output signal from the second charge amplification circuit.

In the aspect of the physical quantity detection circuit, the physical quantity detection circuit may further include a failure diagnosis circuit that performs failure diagnosis based on the vibration leakage signal.

In the aspect of the physical quantity detection circuit, the failure diagnosis circuit may diagnose a state of the physical quantity detection circuit as failure when a magnitude of the vibration leakage signal does not fall within a first range.

In the aspect of the physical quantity detection circuit, the first range may be variable.

An aspect of a physical quantity sensor according to the present disclosure includes the physical quantity detection circuit according to the aspect described above and the physical quantity detection device.

An aspect of an electronic instrument according to the present disclosure includes the physical quantity sensor according to the aspect described above and a processing circuit that carries out a process based on an output signal from the physical quantity sensor.

An aspect of a vehicle according to the present disclosure includes the physical quantity sensor according to the aspect described above and a processing circuit that carries out a process based on an output signal from the physical quantity sensor.

An aspect of a method for diagnosing failure of a physical quantity sensor according to the present disclosure is a method for diagnosing failure of a physical quantity sensor including a physical quantity detection device that detects a physical quantity and outputs a first signal and a second signal and a physical quantity detection circuit that generates a physical quantity detection signal according to the physical quantity detected with the physical quantity detection device based on the first and second signals, the first signal containing a first physical quantity component based on the physical quantity detected with the physical quantity detection device and a first vibration leakage component based on vibration of the physical quantity detection device, the second signal containing a second physical quantity component based on the physical quantity detected with the physical quantity detection device and a second vibration leakage component based on the vibration of the physical quantity detection device, the first and second physical quantity components having opposite phases, and the first and second vibration leakage components having the same phase, the method including a differential amplification step of differentially amplifying a signal pair based on the first and second signals outputted from the physical quantity detection device, an adding step of adding the signal pair, a first synchronous wave-detection step of performing synchronous wave-detection on a signal based on a signal obtained in the differential amplification step to generate a signal according to a difference between the first physical quantity component and the second physical quantity component, a second synchronous wave-detection step of performing synchronous wave-detection on a signal based on a signal obtained in the adding step to generate a signal according to a sum of the first vibration leakage component and the second vibration leakage component, a physical quantity detection signal generation step of generating the physical quantity detection signal based on a signal generated in the first synchronous wave-detection step, a vibration leakage signal generation step of generating a vibration leakage signal based on a signal generated in the second synchronous wave-detection step, and a failure diagnosis step of diagnosing failure of the physical quantity sensor based on the vibration leakage signal.

DESCRIPTION OF EXEMPLARY EMBODIMENTS

A preferable embodiment of the present disclosure will be described below in detail with reference to the drawings. It is not intended that the embodiment described below unduly limits the contents of the present disclosure set forth in the appended claims. Further, all configurations described below are not necessarily essential configuration requirements of the present disclosure.

The following description will be made with reference to a physical quantity sensor that detects angular velocity as a physical quantity, that is, an angular velocity sensor.

1. Physical Quantity Sensor 1-1. Configuration of Physical Quantity Sensor

Figure 1:
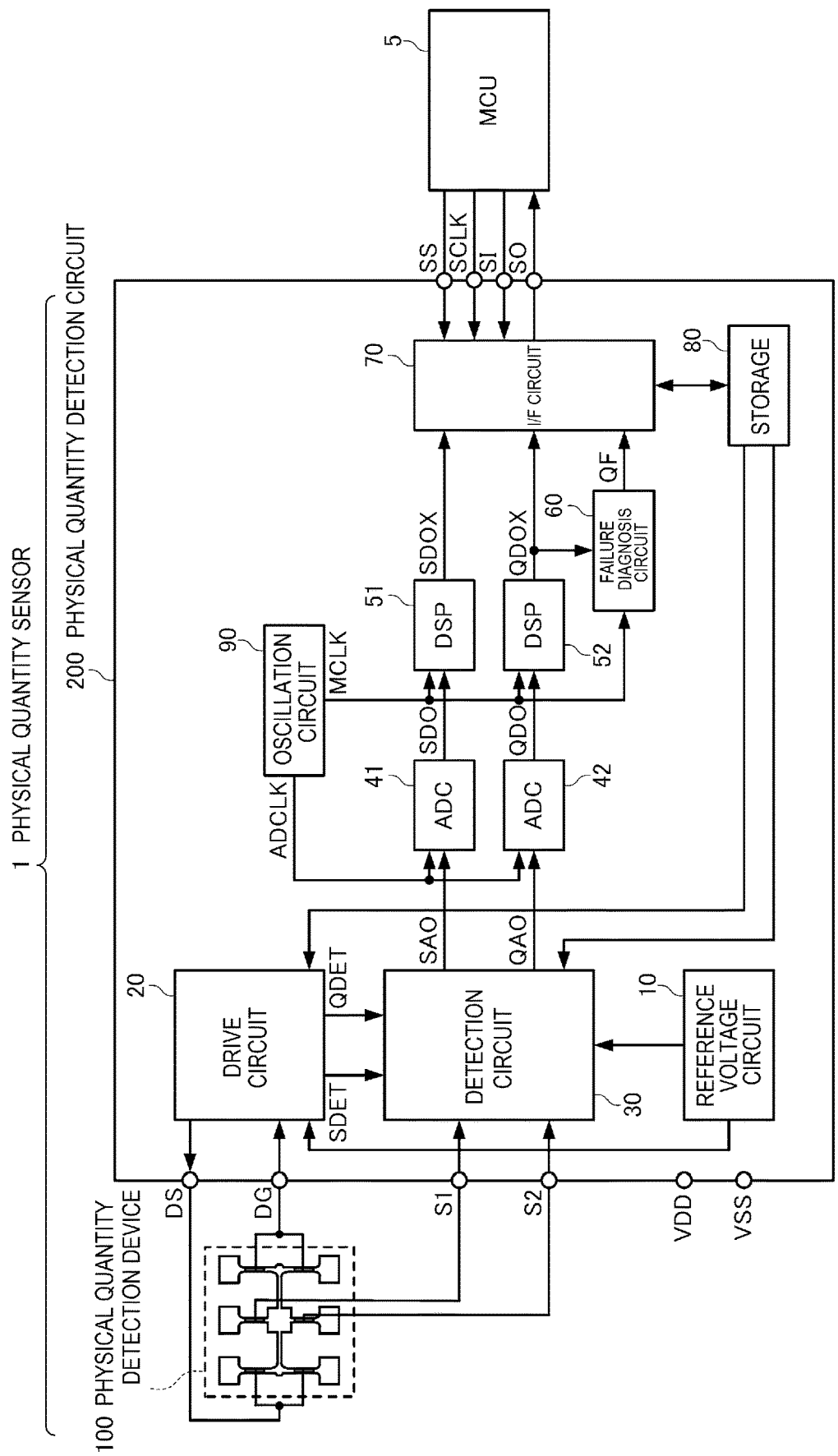
FIG. 1 is a functional block diagram of a physical quantity sensor according to an embodiment of the present disclosure.

FIG. 1 is a functional block diagram of the physical quantity sensor according to the present embodiment. A physical quantity sensor 1 according to the present embodiment includes a physical quantity detection device 100, which detects a physical quantity, and a physical quantity detection circuit 200.

The physical quantity detection device 100 includes a vibration element on which drive electrodes and detection electrodes are disposed, and the vibration element is, in general, encapsulated in a package that ensures hermeticity thereof to increase the oscillation efficiency of the vibration element by minimizing the impedance thereof. In the present embodiment, the physical quantity detection device 100 includes what is called a double-T-shaped vibration element having two T-shaped drive vibration arms.

Figure 2:
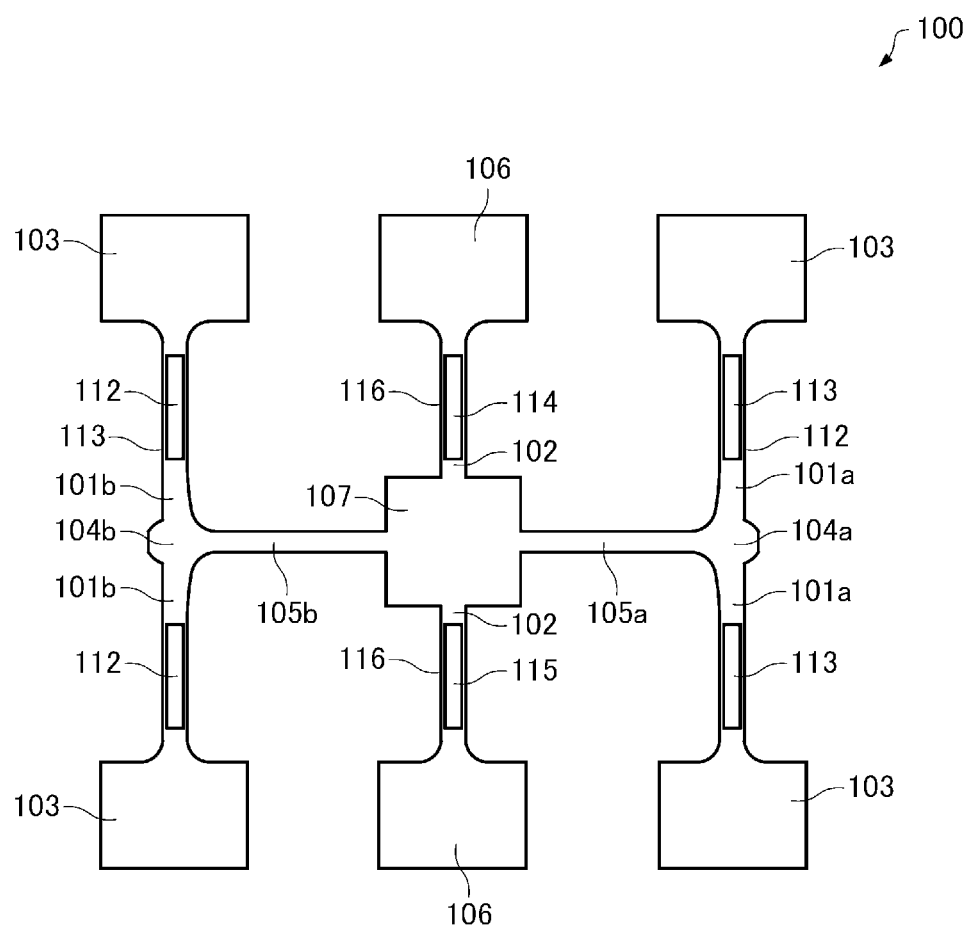
FIG. 2 is a plan view of a vibration element of a gyro sensor device.

FIG. 2 is a plan view of the vibration element of the physical quantity detection device 100 in the present embodiment. The physical quantity detection device 100 includes a double-T-shaped vibration element formed, for example, of a Z-cut quartz crystal substrate. A vibration element made of quartz crystal advantageously allows an increase in angular velocity detection accuracy because the resonance frequency varies by only a very small amount versus a change in temperature. Axes X, Y, and Z in FIG. 2 represent quartz crystal axes.

The vibration element of the physical quantity detection device 100 has drive vibration arms 101a and 101b extending from two drive bases 104a and 104b, respectively, in the +Y-axis and −Y-axis directions, as shown in FIG. 2. A drive electrode 112 and drive electrodes 113 are formed on the side surface and the upper surfaces of the drive vibrations arms 101a, respectively, and a drive electrode 113 and drive electrodes 112 are formed on the side surface and the upper surfaces of the drive vibrations arms 101b, respectively. The drive electrodes 112 and 113 are coupled to a drive circuit 20 via terminals DS and DG of the physical quantity detection circuit 200 shown in FIG. 1.

The drive bases 104a and 104b are coupled to a rectangular detection base 107 via linkage arms 105a and 105b extending in the −X-axis and +X-axis directions, respectively.

Detection vibration arms 102 extend from the detection base 107 in the +Y-axis and −Y-axis directions. Detection electrodes 114 and 115 are formed on the upper surfaces of the detection vibration arms 102, and common electrodes 116 are formed on the side surfaces of the detection vibration arms 102. The detection electrodes 114 and 115 are coupled to a detection circuit 30 via terminals S1 and S2 of the physical quantity detection circuit 200 shown in FIG. 1, respectively. The common electrodes 116 are grounded.

Figure 3:
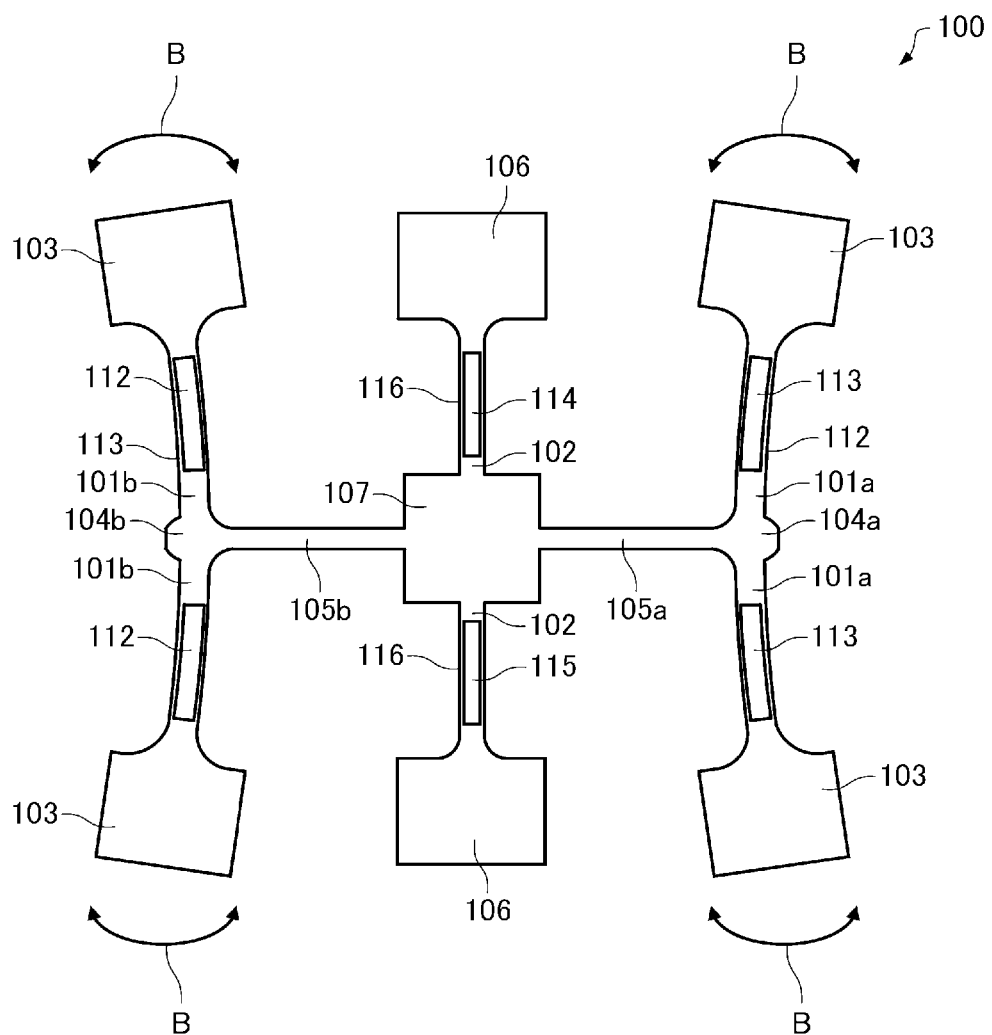
FIG. 3 describes the action of the gyro sensor device.

When AC voltage is applied as a drive signal to the space between each of the drive electrodes 112 and 113 of each of the drive vibration arms 101a and 101b, the inverse piezoelectric effect causes the drive vibration arms 101a and 101b to undergo flexural vibration that causes the tip ends of the two drive vibration arms 101a and 101b to repeatedly approach each other and separate from each other, as indicated by the arrows B shown in FIG. 3. The flexural vibration of the drive vibration arms 101a and 101b is hereinafter also referred to as "excited vibration" in some cases.

Figure 4:
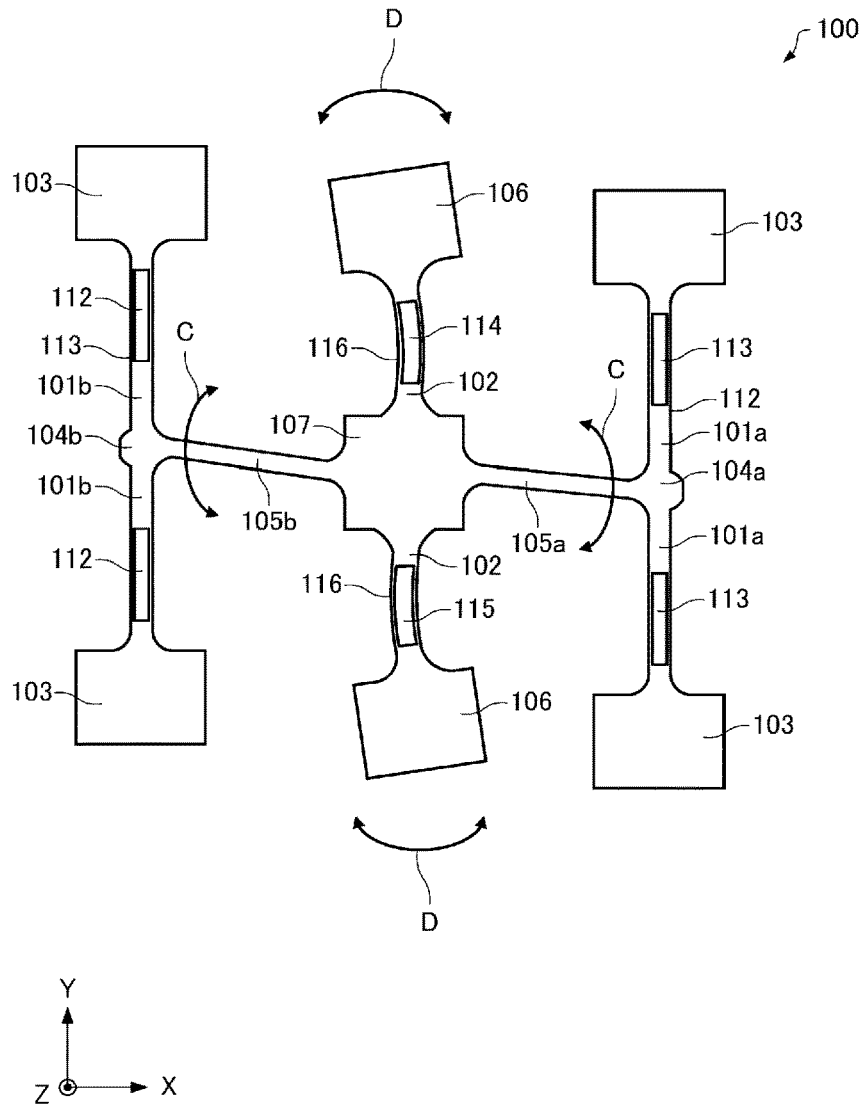
FIG. 4 describes the action of the gyro sensor device.

In this state, when angular velocity around the axis Z acts on the vibration element of the physical quantity detection device 100, the drive vibration arms 101a and 101b receive Coriolis force in the direction perpendicular to both the flexural vibration direction indicated by the arrows B and the axis Z. As a result, the linkage arms 105a and 105b vibrate as indicated by the arrows C, as shown in FIG. 4. The detection vibration arms 102 then undergo flexural vibration as indicated by the arrows D together with the vibration of the linkage arms 105a and 105b. The flexural vibration of the detection vibration arms 102 in association with the Coriolis force and the flexural vibration of the drive vibration arms 101a and 101b are out of phase by 90°.

When the two drive vibration arms 101a and 101b have the same magnitude of vibration energy or the same magnitude of the amplitude of the vibration when the drive vibration arms 101a and 101b undergo the flexural vibration, the drive vibration arms 101a and 101b are balanced with each other in terms of vibration energy thereof, so that the detection vibration arms 102 undergo no flexural vibration in a state in which no angular velocity acts on the physical quantity detection device 100. When the balance of the vibration energy between the two drive vibration arms 101a and 10ab deteriorates, however, the detection vibration arms 102 undergo the flexural vibration even in the state in which no angular velocity acts on the physical quantity detection device 100. The flexural vibration in this state is called leakage vibration and is flexural vibration indicated by the arrows D similar to the vibration based on the Coriolis force but has a phase shifted by 90° from the phase of the vibration based on the Coriolis force.

The piezoelectric effect causes AC charge based on the flexural vibration described above to be produced as the detection electrodes 114 and 115 on the detection vibration arms 102. The AC charge produced based on the Coriolis force changes in accordance with the magnitude of the Coriolis force, that is, the magnitude of the angular velocity acting on the physical quantity detection device 100. On the other hand, AC charge produced based on the leakage vibration is fixed irrespective of the magnitude of the angular velocity acting on the physical quantity detection device 100.

Rectangular weight sections 103, which are wider than the drive vibration arms 101a and 101b, are formed at the tip ends of the drive vibration arms 101a and 101b. Forming the weight sections 103 at the tip ends of the drive vibration arms 101a and 101b allows an increase in the Coriolis force and relatively short vibration arms having a desired resonance frequency. Similarly, weight sections 106 wider than the detection vibration arms 102 are formed at the tip ends of the detection vibration arms 102. Forming the weight sections 106 at the tip ends of the detection vibration arms 102 allows an increase in the AC charge produced at the detection electrodes 114 and 115.

As described above, the physical quantity detection device 100 outputs the AC charge based on the detected physical quantity and the AC charge based on the leakage vibration out of the excited vibration via the detection electrodes 114 and 115. The AC charge based on a physical quantity is hereinafter referred to as a "physical quantity component," and the AC charge based on the leakage vibration is hereinafter referred to as a "vibration leakage component" in some cases. In the present embodiment, the physical quantity detected by the physical quantity detection device 100 is angular velocity according to the Coriolis force.

Referring back to the description with reference to FIG. 1, the physical quantity detection circuit 200 includes a reference voltage circuit 10, the drive circuit 20, the detection circuit 30, an analog/digital conversion circuit 41, an analog/digital conversion circuit 42, a digital signal processing circuit 51, a digital signal processing circuit 52, a failure diagnosis circuit 60, an interface circuit 70, a storage 80, and an oscillation circuit 90. The physical quantity detection circuit 200 may be achieved, for example, by a one-chip integrated circuit (IC). The physical quantity detection circuit 200 may instead be so configured that part of the elements described above is omitted or changed or another element is added to the elements described above.

The reference voltage circuit 10 produces fixed voltage or fixed current, such as reference voltage that is analog ground voltage, based on power supply voltage and ground voltage supplied via terminals VDD and VSS of the physical quantity detection circuit 200 and supplies the drive circuit 20 and the detection circuit 30 with the fixed voltage or current.

The drive circuit 20 generates the drive signal for causing the physical quantity detection device 100 to undergo the excited vibration and supplies the drive electrodes 112 on the physical quantity detection device 100 via the terminal DS. The drive circuit 20 receives oscillation current produced at the drive electrodes 113 by the excited vibration of the physical quantity detection device 100 via the terminal DG and performs feedback control on the amplitude level of the drive signal in such a way that the amplitude of the oscillation current is held at a fixed value. Further, the drive circuit 20 generates a wave-detection signal SDET having the same phase as that of the drive signal and a wave-detection signal QDET having a phase different by 90° from that of the drive signal and outputs the wave-detection signals SDET and QDET to the detection circuit 30.

The detection circuit 30 receives the AC charges produced at the two detection electrodes 114 and 115 on the physical quantity detection device 100 via the terminals S1 and S2 of the physical quantity detection circuit 200, respectively, uses the wave-detection signal SDET to detect the physical quantity components contained in the AC charges, and generates and outputs a physical quantity detection signal SAO, which is an analog signal having a voltage level according to the magnitudes of the physical quantity components. Further, the detection circuit 30 detects the vibration leakage components contained in the AC charges inputted via the terminals S1 and S2 and generates and outputs a vibration leakage signal QAO, which is an analog signal having a voltage level according to the magnitudes of the vibration leakage components.

The storage 80 includes a nonvolatile memory that is not shown, and the nonvolatile memory stores a variety of trimming data for the drive circuit 20 and the detection circuit 30, for example, adjustment data and correction data. The nonvolatile memory may be formed, for example, of a MONOS (metal oxide nitride oxide silicon) memory or an EEPROM (electrically erasable programmable read-only memory). Further, the storage 80 may include a register that is not shown, and when the physical quantity detection circuit 200 is powered on, that is, when the voltage at the terminal VDD rises from 0 V to desired voltage, the variety of trimming data stored in the nonvolatile memory may be transferred and held in the register, and the variety of trimming data held in the register may be supplied to the drive circuit 20 and the detection circuit 30.

The analog/digital conversion circuit 41 operates based on a clock signal ADCLK, converts the physical quantity detection signal SAO, which is an analog signal, into a physical quantity detection signal SDO, which is a digital signal, and outputs the physical quantity detection signal SDO.

The analog/digital conversion circuit 42 operates based on the clock signal ADCLK, converts the vibration leakage signal QAO, which is an analog signal, into a vibration leakage signal QDO, which is a digital signal, and outputs the vibration leakage signal QDO.

The digital signal processing circuit 51 operates based on a master clock signal MCLK, performs predetermined computation on the physical quantity detection signal SDO outputted from the analog/digital conversion circuit 41, and outputs a physical quantity detection signal SDOX provided by the computation.

The digital signal processing circuit 52 operates based on the master clock signal MCLK, performs predetermined computation on the vibration leakage signal QDO outputted from the analog/digital conversion circuit 42, and outputs a vibration leakage signal QDOX provided by the computation.

The failure diagnosis circuit 60 operates based on the master clock signal MCLK and diagnoses failure of the physical quantity sensor 1 based on the vibration leakage signal QDOX. The failure diagnosis circuit 60 then outputs a failure diagnosis result signal QF representing whether or not the physical quantity sensor 1 has failed. When the physical quantity sensor 1 operates normally, the magnitude of the vibration leakage signal QDOX falls within a predetermined range. In contrast, for example, when part of the physical quantity detection device 100 breaks, when part of a wiring line electrically coupled to the detection electrode 114 on the physical quantity detection device 100 is cut and decoupled or short-circuited, or when part of a wiring line electrically coupled to the detection electrode 115 on the physical quantity detection device 100 is cut and decoupled or short-circuited, the magnitude of the vibration leakage signal QDOX does not falls within the predetermined range. The failure diagnosis circuit 60 may therefore diagnose the state of the physical quantity sensor 1 as failure when the magnitude of the vibration leakage signal QDOX does not fall within a first range. For example, the first range may be so set as to contain a design value of the vibration leakage signal QDOX and further contain a range over which the vibration leakage signal QDOX deviates from the design value over time. The first range may be fixed or may vary. For example, the first range may be so set as to vary in accordance with a value stored in the register, which is provided in the storage 80 and is rewritable by a component external to the physical quantity detection circuit 200.

The interface circuit 70 outputs the physical quantity detection signal SDOX outputted from the digital signal processing circuit 51 and the failure diagnosis result signal QF to a micro control unit (MCU) 5, which is an apparatus external to the physical quantity detection circuit 200, in accordance with a request from the MCU 5. The interface circuit 70 may further output the vibration leakage signal QDOX outputted from the digital signal processing circuit 52 to the MCU 5 in accordance with a request from the MCU 5. The interface circuit 70 reads and outputs the data stored in the nonvolatile memory or the register of the storage 80 to the MCU 5 and writes data inputted from the MCU 5 onto the nonvolatile memory or the register of the storage 80. For example, the MCU 50 may write the value for setting the first range described above onto a predetermined register.

The interface circuit 70 is, for example, an SPI-(serial peripheral interface)-bus-based interface circuit, receives a selection signal, a clock signal, and a data signal transmitted from the MCU 5 via terminals SS, SCLK, and SI of the physical quantity detection circuit 200, and outputs a data signal to the MCU 5 via a terminal SO of the physical quantity detection circuit 200. The interface circuit 70 may instead be an interface circuit that handles a variety of buses excluding an SPI bus, for example, an $I^2C$ (inter-integrated circuit) bus.

The oscillation circuit 90 produces the master clock signal MCLK and supplies the digital signal processing circuits 51 and 52 and the failure diagnosis circuit 60 with the master clock signal MCLK. The oscillation circuit 90 further divides the master clock signal MCLK by an integer to generate the clock signal ADCLK and supplies the analog/digital conversion circuits 41 and 42 with the clock signal ADCLK. The oscillation circuit 90 may generate the master clock signal MCLK, for example, by using a ring oscillator or a CR oscillation circuit.

In the thus configured physical quantity sensor 1, the physical quantity detection device 100 outputs a first signal carrying the AC charge produced at the detection electrode 114 and a second signal carrying the AC charge produced at the detection electrode 115, and the physical quantity detection circuit 200 generates the physical quantity detection signal SDOX according to the physical quantity detected with the physical quantity detection device 100 based on the first and second signals outputted from the physical quantity detection device 100.

1-2. Configuration of Drive Circuit

Figure 5:
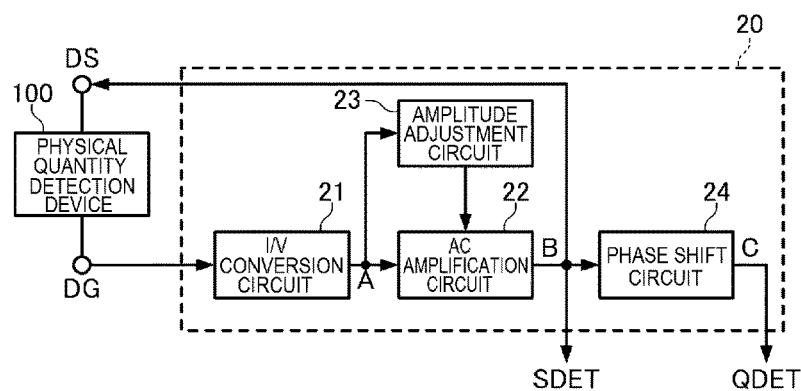
FIG. 5 shows an example of the configuration of a drive circuit.

FIG. 5 shows an example of the configuration of the drive circuit 20. The drive circuit 20 includes a current-voltage conversion circuit 21, an AC amplification circuit 22, an amplitude adjustment circuit 23, and a phase shift circuit 24, as shown in FIG. 5.

The oscillation current produced at the drive electrodes 113 by the excited vibration of the physical quantity detection device 100 is inputted to the current-voltage conversion circuit 21 via the terminal DG and converted by the current-voltage conversion circuit 21 into an AC voltage signal. The AC voltage signal outputted from the current-voltage conversion circuit 21 is inputted to the AC amplification circuit 22 and the amplitude adjustment circuit 23.

The AC amplification circuit 22 amplifies the inputted AC voltage signal, clips the amplified AC voltage signal at a predetermined voltage value, and outputs the resultant square-wave drive signal. The amplitude adjustment circuit 23 changes the amplitude of the drive signal in accordance with the level of the AC voltage signal outputted by the current-voltage conversion circuit 21 to control the AC amplification circuit 22 in such a way that the amplitude of the oscillation current is held at a fixed value.

The drive signal outputted from the AC amplification circuit 22 is supplied to the drive electrodes 112 on the physical quantity detection device 100 via the terminal DS. The physical quantity detection device 100 to which the drive signal is supplied can continue the excited vibration. Further, keeping the oscillation current fixed allows the drive vibration arms 101a and 101b of the physical quantity detection device 100 to vibrate at a fixed vibration speed. The vibration speed based on which the Coriolis force is produced is therefore fixed, whereby the sensitivity of the physical quantity sensor 1 can be more stabilized.

The AC amplification circuit 22 outputs the wave-detection signal SDET, which is a square wave and has the same phase as that of the drive signal, and the phase shift circuit 24 outputs the wave-detection signal QDET, the phase of which advances by 90° with respect to the phase of the wave-detection signal SDET. The wave-detection signals SDET and QDET are supplied to the detection circuit 30.

1-3. Configuration of Detection Circuit

Figure 6:
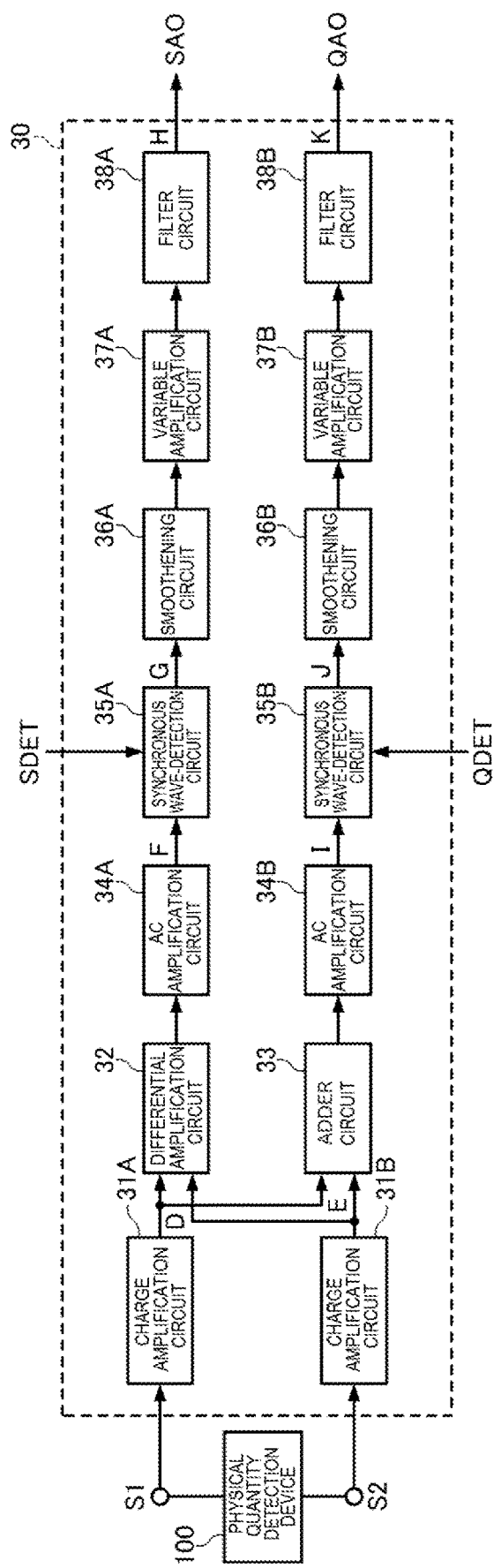
FIG. 6 shows an example of the configuration of a detection circuit.

FIG. 6 shows an example of the configuration of the detection circuit 30. The detection circuit 30 includes charge amplification circuits 31A and 31B, a differential amplification circuit 32, an adder circuit 33, AC amplification circuits 34A and 34B, synchronous wave-detection circuits 35A and 35B, smoothening circuits 36A and 36B, variable amplification circuits 37A and 37B, and filter circuits 38A and 38B, as shown in FIG. 6.

The first signal is inputted to the charge amplification circuit 31A via the terminal S1. The first signal carries the AC charge produced at the detection electrode 114 on the physical quantity detection device 100 and contains a first physical quantity component based on the physical quantity detected by the physical quantity detection device 100 and a first vibration leakage component based on the vibration of the physical quantity detection device 100.

The second signal is inputted to the charge amplification circuit 31B via the terminal S2. The second signal carries the AC charge produced at the detection electrode 115 on the physical quantity detection device 100 and contains a second physical quantity component based on the physical quantity detected by the physical quantity detection device 100 and a second vibration leakage component based on the vibration of the physical quantity detection device 100.

In the present embodiment, when angular velocity acts on the physical quantity detection device 100, the detection vibration arm 102 on which the detection electrode 114 is formed and the detection vibration arm 102 on which the detection electrode 115 is formed undergo flexural vibration in opposite directions in a balanced manner. The first and second physical quantity components therefore have opposite phases. The case where the first and second physical quantity components have opposite phases is not limited to the case where the difference in phase between the first and second physical quantity components is exactly 180° and also includes a case where the difference in phase between the first and second physical quantity components deviates from 180° by a very small amount due, for example, to errors in the manufacture of the physical quantity detection device 100 and errors in delay time that occurs along the signal propagation path.

In the present embodiment, the first and second vibration leakage components have the same phase. The case where the first and second vibration leakage components have the same phase is not limited to the case where the difference in phase between the first and second vibration leakage components is exactly 0° and also includes a case where the difference in phase between the first and second vibration leakage components deviates from 0° by a very small amount due, for example, to errors in the manufacture of the physical quantity detection device 100 and errors in delay time that occurs along the signal propagation path.

For example, tuning the weights of the four weight sections 103 in such a way that the two drive vibration arms 101a have the same vibration energy, that the two drive vibration arms 101b have the same vibration energy, and that the total vibration energy of the two drive vibration arms 101a differs from the total vibration energy of the two drive vibration arms 101b allows the first and second vibration leakage components to have the same phase. The greater the difference between the total vibration energy of the two drive vibration arms 101a and the total vibration energy of the two drive vibration arms 101b, the greater the first and second vibration leakage components. The weights of the weight sections 103 can be tuned, for example, by irradiating each of the weight sections 103 with a laser beam to cut part of the weight section 103.

The charge amplification circuit 31A converts the first signal into an AC voltage signal defined with respect to reference voltage $V_{ref}$ produced by the reference voltage circuit 10 and outputs the AC voltage signal, and the charge amplification circuit 31B converts the second signal into an AC voltage signal defined with respect to the reference voltage $V_{ref}$ and outputs the AC voltage signal. The charge amplification circuit 31A is an example of a "first charge amplification circuit," and the charge amplification circuit 31B is an example of a "second charge amplification circuit."

The differential amplification circuit 32 differentially amplifies the signal pair formed of the output signals from the charge amplification circuits 31A and 31B. The signal pair is a signal pair based on the first and second signals. Since the first and second physical quantity components have opposite phases, as described above, the differential amplification circuit 32 amplifies the physical quantity components. On the other hand, since the first and second vibration leakage components have the same phase, the differential amplification circuit 32 attenuates the vibration leakage components. Therefore, in the output signal from the differential amplification circuit 32, the influence of the vibration leakage components on the physical quantity components decreases. To substantially eliminate the influence of the vibration leakage components on the physical quantity components in the output signal from the differential amplification circuit 32, the amount of difference between the first and second vibration leakage components is desirably substantially zero. The case where the amount of difference between the first and second vibration leakage components is substantially zero is not limited to a case where the amount of difference is exactly zero and includes a case where the amount of difference deviates from zero by a very small amount due, for example, to the minimum adjustment resolution of the first and second vibration leakage components and a case where a measured value of the amount of difference between the first and second vibration leakage components deviates from zero by a very small amount due to an error in measurement of the amount of the difference.

The AC amplification circuit 34A amplifies the output signal from the differential amplification circuit 32. The output signal from the AC amplification circuit 34A is inputted to the synchronous wave-detection circuit 35A.

The synchronous wave-detection circuit 35A performs synchronous wave detection on the output signal from the AC amplification circuit 34A as a wave detection target signal by using the wave-detection signal SDET. The synchronous wave-detection circuit 35A extracts the physical quantity component contained in the output signal from the AC amplification circuit 34A. That is, the synchronous wave-detection circuit 35A performs synchronous wave detection on the output signal from the AC amplification circuit 34A, which is a signal based on the output signal from the differential amplification circuit 32, and outputs a signal according to the difference between the first physical quantity component contained in the first signal and the second physical quantity component contained in the second signal. The synchronous wave-detection circuit 35A may, for example, be a switch circuit that selects the output signal from the AC amplification circuit 34A when the voltage level of the wave-detection signal SDET is higher than the reference voltage $V_{ref}$ and selects the output signal outputted from the AC amplification circuit 34A but reversed with respect to the reference voltage $V_{ref}$ when the voltage level of the wave-detection signal SDET is lower than the reference voltage $V_{ref}$. The synchronous wave-detection circuit 35A is an example of a "first synchronous wave-detection circuit."

The output signal from the synchronous wave-detection circuit 35A is smoothened by the smoothening circuit 36A into a DC voltage signal, which is then inputted to the variable amplification circuit 37A.

The variable amplification circuit 37A amplifies or attenuates the output signal from the smoothening circuit 36A by using a set gain to adjust the detection sensitivity of the physical quantity sensor 1. The signal amplified or attenuated by the variable amplification circuit 37A is inputted to the filter circuit 38A.

The filter circuit 38A is a circuit that limits the frequency of the output signal from the variable amplification circuit 37A to a frequency that belongs to a desired frequency band. The output signal from the filter circuit 38A is outputted as the physical quantity detection signal SAO from the detection circuit 30.

The smoothening circuit 36A, the variable amplification circuit 37A, the filter circuit 38A, the analog/digital conversion circuit 41, and the digital signal processing circuit 51 are circuits that generate the physical quantity detection signal SDOX based on the output signal from the synchronous wave-detection circuit 35A and are an example of a "physical quantity detection signal generation circuit."

The adder circuit 33 adds the signal pair formed of the output signal from the charge amplification circuit 31A to the output signal from the charge amplification circuit 31B. Since the first and second physical quantity components have opposite phases, as described above, the adder circuit 33 attenuates the physical quantity components. On the other hand, since the first and second vibration leakage components have the same phase, the adder circuit 33 amplifies the vibration leakage components.

The AC amplification circuit 34B amplifies the output signal from the adder circuit 33. The output signal from the AC amplification circuit 34B is inputted to the synchronous wave-detection circuit 35B.

The synchronous wave-detection circuit 35B performs synchronous wave detection on the output signal from the AC amplification circuit 34B as a wave detection target signal by using the wave-detection signal QDET. The synchronous wave-detection circuit 35B extracts the physical quantity component contained in the output signal from the AC amplification circuit 34B. That is, the synchronous wave-detection circuit 35B performs synchronous wave detection on the output signal from the AC amplification circuit 34B, which is a signal based on the output signal from the adder circuit 33, and outputs a signal according to the sum of the first vibration leakage component contained in the first signal and the second vibration leakage component contained in the second signal. The synchronous wave-detection circuit 35B may, for example, be a switch circuit that selects the output signal from the AC amplification circuit 34B when the voltage level of the wave-detection signal QDET is higher than the reference voltage $V_{ref}$ and selects the output signal outputted from the AC amplification circuit 34B but reversed with respect to the reference voltage $V_{ref}$ when the voltage level of the wave-detection signal QDET is lower than the reference voltage $V_{ref}$. The synchronous wave-detection circuit 35B is an example of a "second synchronous wave-detection circuit."

The output signal from the synchronous wave-detection circuit 35B is smoothened by the smoothening circuit 36B into a DC voltage signal, which is then inputted to the variable amplification circuit 37B.

The variable amplification circuit 37B amplifies or attenuates the output signal from the smoothening circuit 36B by using a set gain. The signal amplified or attenuated by the variable amplification circuit 37B is inputted to the filter circuit 38B.

The filter circuit 38B is a circuit that limits the frequency of the output signal from the variable amplification circuit 37B to a frequency that belongs to a desired frequency band. The output signal from the filter circuit 38B is outputted as the vibration leakage signal QAO from the detection circuit 30.

The smoothening circuit 36B, the variable amplification circuit 37B, the filter circuit 38B, the analog/digital conversion circuit 42, and the digital signal processing circuit 52 are circuits that generate the vibration leakage signal QDOX based on the output signal from the synchronous wave-detection circuit 35B and are an example of a "vibration leakage signal generation circuit."

1-4. Example of Signal Waveforms

Figure 7:
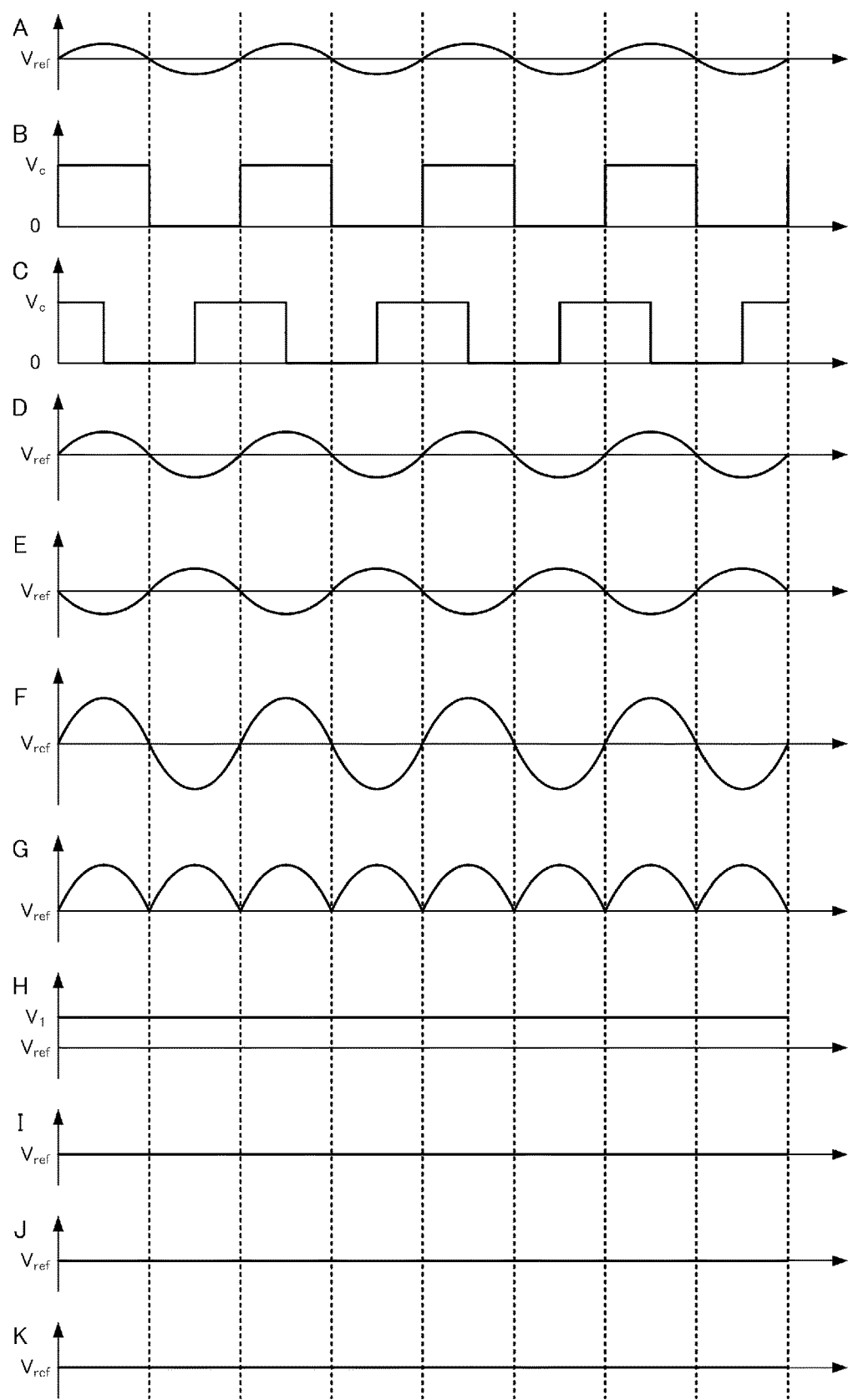
FIG. 7 shows an example of the waveforms of a variety of signals carrying physical quantity components contained in an output signal from a physical quantity detection device.

FIG. 7 shows an example of the waveforms of a variety of signals carrying the physical quantity components contained in the AC charges outputted from the physical quantity detection device 100. FIG. 7 shows the waveforms of the signals between the points A and C shown in FIG. 5 and the waveforms of the signals between the points D and K shown in FIG. 6. The waveforms of the signals are drawn with the horizontal axis representing the time and the vertical axis representing the voltage. FIG. 7 shows a case where fixed angular velocity acts on the physical quantity detection device 100.

The signal at the point A is the output signal from the current-voltage conversion circuit 21 and is a fixed-frequency signal that changes with respect to the reference voltage $V_{ref}$ to values on opposite sides thereof.

The signal at the point B is the output signal from the AC amplification circuit 22, that is, the wave-detection signal SDET, and is a square-wave voltage signal having the same phase as that of the signal at the point A and having an amplitude of a fixed value $V_c$.

The signal at the point C is the output signal from the phase shift circuit 24, that is, the wave-detection signal QDET, and is a square-wave voltage signal having a phase that advances by 90° with respect to the phase of the signal at the point B and having an amplitude of the fixed value $V_c$.

The signal at the point D is a fixed-frequency signal that carries the first physical quantity component contained in the output signal from the charge amplifier circuit 31A, has the same phase as that of the signal at the point A, and changes with respect to the reference voltage $V_{ref}$ to values on opposite sides thereof.

The signal at the point E is a fixed-frequency signal that carries the second physical quantity component contained in the output signal from the charge amplifier circuit 31B, has a phase different from that of the signal at the point A by 180°, and changes with respect to the reference voltage $V_{ref}$ to values on opposite sides thereof. The first physical quantity component contained in the signal at the point D and the second physical quantity component contained in the signal at the point E have opposite phases but substantially the same amplitude.

The signal at the point F is a fixed-frequency signal that carries the physical quantity component contained in the output signal from the AC amplification circuit 34A, that is, the first physical quantity component contained in the signal at the point D and the second physical quantity component contained in the signal at the point R that are differentially amplified, has the same phase as that of the signal at the point A, and changes with respect to the reference voltage $V_{ref}$ to values on opposite sides thereof.

The signal at the point G is a signal that carries the physical quantity component contained in the output signal from the synchronous wave-detection circuit 35A, that is, the physical quantity component contained in the signal at the point F but caused to undergo full-wave rectification by using the signal at the point B with respect to the reference voltage $V_{ref}$.

The signal at the point H is a signal that carries the physical quantity component contained in the output signal from the filter circuit 38A and has a voltage value $V_1$ according to the physical quantity detected by the physical quantity detection device 100.

The signal at the point I is a signal that carries the physical quantity component contained in the output signal from the AC amplification circuit 34B, that is, the first physical quantity component contained in the signal at the point D and the second physical quantity component contained in the signal at the point E that are so summed up and amplified as to be substantially removed and has a voltage value equal to the reference voltage $V_{ref}$.

The signal at the point J is a signal that carries the physical quantity component contained in the output signal from the synchronous wave-detection circuit 35B, that is, the physical quantity component contained in the signal at the point I but caused to undergo full-wave rectification by using the signal at the point C with respect to the reference voltage $V_{ref}$ and has a voltage value equal to the reference voltage $V_{ref}$.

The signal at the point K is a signal that carries the physical quantity component contained in the output signal from the filter circuit 38B and has a voltage value equal to the reference voltage $V_{ref}$.

Figure 8:
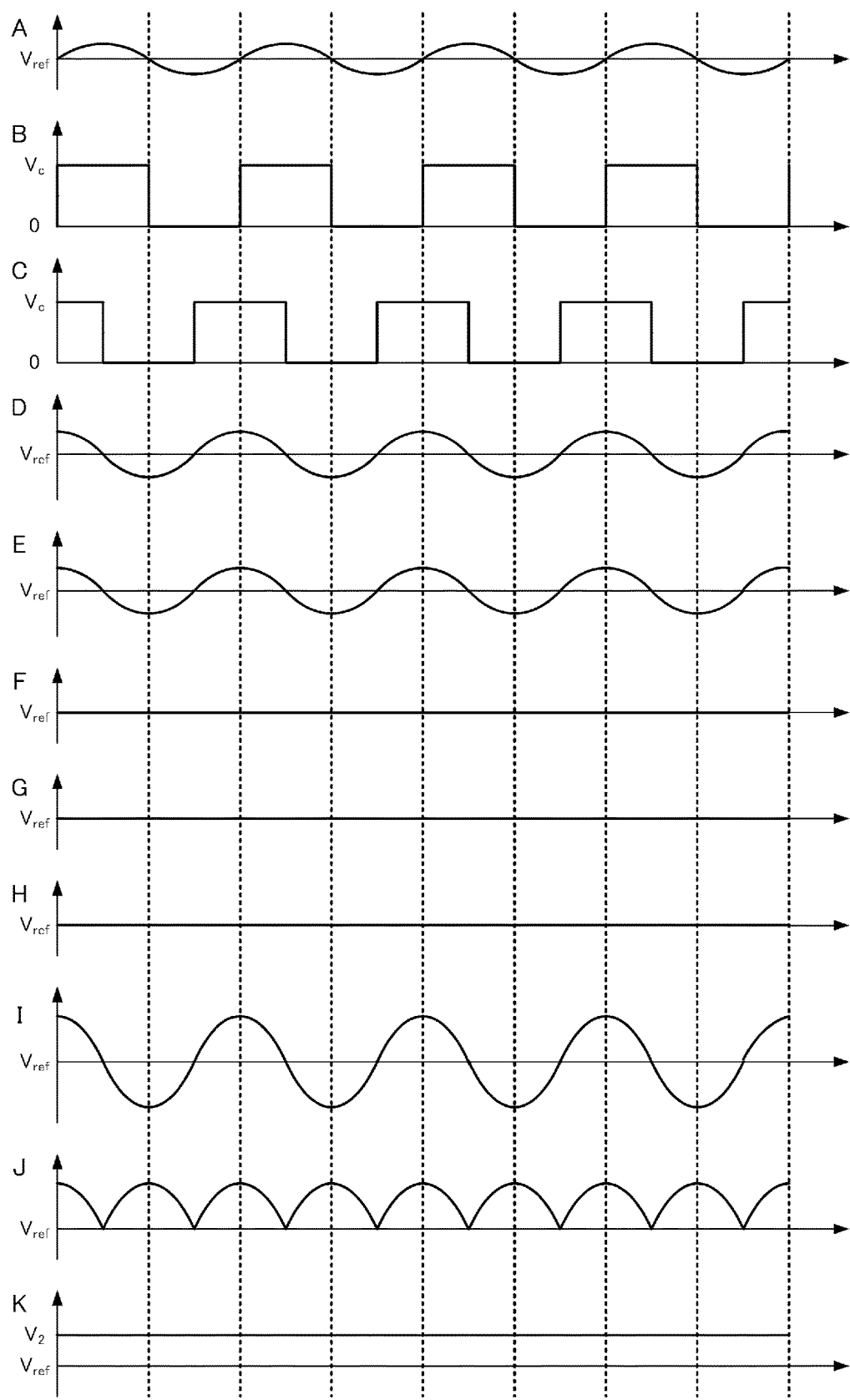
FIG. 8 shows an example of the waveforms of the variety of signals carrying vibration leakage components contained in the output signal from the physical quantity detection device.

FIG. 8 shows an example of the waveforms of the variety of signals carrying the vibration leakage components contained in the AC charges outputted from the physical quantity detection device 100. FIG. 8 shows the waveforms of the signals between the points A and C shown in FIG. 5 and the waveforms of the signals between the points D and K shown in FIG. 6. The waveforms of the signals are drawn with the horizontal axis representing the time and the vertical axis representing the voltage.

In FIG. 8, the signals at the points A, B, and C are the same as those in FIG. 7.

The signal at the point D is a fixed-frequency signal that carries the first vibration leakage component contained in the output signal from the charge amplifier circuit 31A, has a phase that advances by 90° with respect to the phase of the signal at the point A, and changes with respect to the reference voltage $V_{ref}$ to values on opposite sides thereof.

The signal at the point E is a fixed-frequency signal that carries the second vibration leakage component contained in the output signal from the charge amplifier circuit 31B, has a phase that advances by 90° with respect to the phase of the signal at the point A, and changes with respect to the reference voltage $V_{ref}$ to values on opposite sides thereof. The first vibration leakage component contained in the signal at the point D and the second vibration leakage component contained in the signal at the point E have the same phase and substantially the same amplitude.

The signal at the point F is a signal that carries the vibration leakage component contained in the output signal from the AC amplification circuit 34A, that is, the first vibration leakage component contained in the signal at the point D and the second vibration leakage component contained in the signal at the point E that are differentially amplified as to be substantially removed and has a voltage value equal to the reference voltage $V_{ref}$.

The signal at the point G is a signal that carries the vibration leakage component contained in the output signal from the synchronous wave-detection circuit 35A, that is, the vibration leakage component contained in the signal at the point F but caused to undergo full-wave rectification by using the signal at the point B with respect to the reference voltage $V_{ref}$ and has a voltage value equal to the reference voltage $V_{ref}$.

The signal at the point H is a signal that carries the vibration leakage component contained in the output signal from the filter circuit 38A and has a voltage value equal to the reference voltage $V_{ref}$.

The signal at the point I is a signal that carries the vibration leakage component contained in the output signal from the AC amplification circuit 34B, that is, the first vibration leakage component contained in the signal at the point D and the second vibration leakage component contained in the signal at the point E that are summed up and amplified, has a phase that advances by 90° with respect to the phase of the signal at the point A, and changes with respect to the reference voltage $V_{ref}$ to values on opposite sides thereof.

The signal at the point J is a signal that carries the vibration leakage component contained in the output signal from the synchronous wave-detection circuit 35B, that is, the vibration leakage component contained in the signal at the point I but caused to undergo full-wave rectification by using the signal at the point C with respect to the reference voltage $V_{ref}$.

The signal at the point K is a signal that carries the vibration leakage component contained in the output signal from the filter circuit 38B and has a voltage value V2 according to the vibration leakage that occurs at the physical quantity detection device 100.

In practice, the signals at the points D to K each have the waveforms in FIG. 7 added to the waveforms in FIG. 8. Since the signal at the point H in FIG. 8 is a signal having a voltage value equal to the reference voltage $V_{ref}$, the output signal from the filter circuit 38A, that is, the physical quantity detection signal SAO hardly contains a vibration leakage component, substantially coincides with the signal at the point H in FIG. 7, and is a signal having the voltage level according to the physical quantity components. Therefore, the MCU 5 can measure the physical quantity having acted on the physical quantity sensor 1 by reading the physical quantity detection signal SDOX generated based on the physical quantity detection signal SAO.

Since the signal at the point K in FIG. 7 is a signal having a voltage value equal to the reference voltage $V_{ref}$, the output signal from the filter circuit 38B, that is, the vibration leakage signal QAO hardly contains a physical quantity component, substantially coincides with the signal at the point K in FIG. 8, and is a signal having the voltage level according to the vibration leakage components. When the physical quantity sensor 1 operates normally, the vibration leakage signal QAO has a substantially fixed voltage level. The failure diagnosis circuit 60 can therefore diagnose the state of the physical quantity sensor 1 as failure when the magnitude of the vibration leakage signal QDOX generated based on the vibration leakage signal QAO does not fall within the first range.

1-5. Procedure of Failure Diagnosis Method

Figure 9:
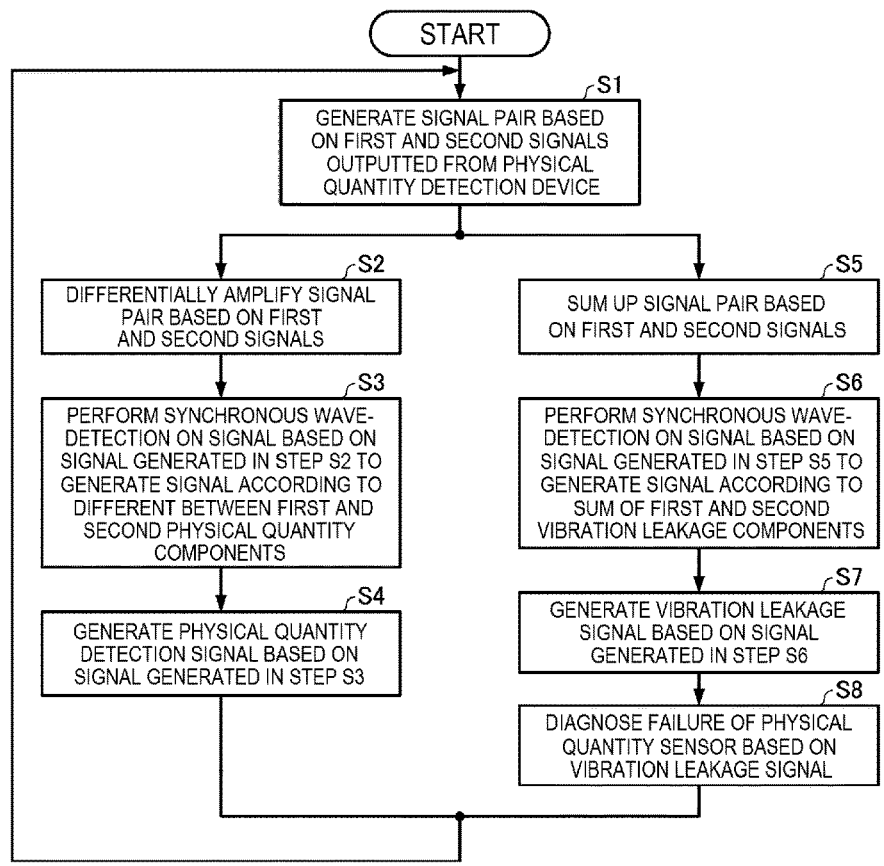
FIG. 9 is a flowchart showing an example of the procedure of a failure diagnosis method according to the present embodiment.

FIG. 9 is a flowchart showing an example of the procedure of a method for diagnosing failure of the physical quantity sensor 1 according to the present embodiment. In the flowchart shown in FIG. 9, the processes in the steps may be swapped as appropriate.

In the method for diagnosing failure of the physical quantity sensor 1 according to the present embodiment, the charge amplifier circuits 31A and 31B of the physical quantity detection circuit 200 first generate a signal pair based on the first and second signals outputted from the physical quantity detection device 100 (step S1), as shown in FIG. 9. The first signal is a signal containing the first physical quantity component based on a physical quantity detected with the physical quantity detection device 100 and the first vibration leakage component based on the vibration of the physical quantity detection device 100, and the first signal is inputted to the charge amplifier circuit 31A via the terminal S1. The second signal is a signal containing the second physical quantity component based on the physical quantity detected with the physical quantity detection device 100 and the second vibration leakage component based on the vibration of the physical quantity detection device 100, and the second signal is inputted to the charge amplifier circuit 31B via the terminal S2. The first and second physical quantity components have opposite phases, as the signals at the points D and E in FIG. 7. The first and second vibration leakage components have the same phase, as the signals at the points D and E in FIG. 8.

The differential amplification circuit 32 of the physical quantity detection circuit 200 then differentially amplifies the signal pair produced in step S1 based on the first and second signals (step S2).

The synchronous wave-detection circuit 35A of the physical quantity detection circuit 200 then performs synchronous wave-detection on a signal based on the signal generated in step S2 to generate a signal according to the difference between the first and second physical quantity components (step S3).

The physical quantity detection signal generation circuit of the physical quantity detection circuit 200 then generates the physical quantity detection signal SDOX based on the signal generated in step S3 (step S4). The physical quantity detection signal generation circuit is a circuit formed of the smoothening circuit 36A, the variable amplification circuit 37A, the filter circuit 38A, the analog/digital conversion circuit 41, and the digital signal processing circuit 51.

The physical quantity detection circuit 200 carries out the processes in steps S5, S6, S7, and S8 concurrently with the processes in steps S2, S3, and S4.

Specifically, the adder circuit 33 of the physical quantity detection circuit 200 first adds the signal pair generated in step S1 based on the first and second signals (step S5).

The synchronous wave-detection circuit 35B of the physical quantity detection circuit 200 then performs synchronous wave-detection on a signal based on the signal generated in step S5 to generate a signal according to the sum of the first and second vibration leakage components (step S6).

The vibration leakage signal generation circuit of the physical quantity detection circuit 200 then generates the vibration leakage signal QDOX based on the signal generated in step S6 (step S7). The vibration leakage signal generation circuit is a circuit formed of the smoothening circuit 36B, the variable amplification circuit 37B, the filter circuit 38B, the analog/digital conversion circuit 42, and the digital signal processing circuit 52.

The failure diagnosis circuit 60 of the physical quantity detection circuit 200 diagnoses failure of the physical quantity sensor 1 based on the vibration leakage signal QDOX generated in step S7 (step S8).

The physical quantity detection circuit 200 then repeatedly carries out the processes in steps S1 to S8.

Step S2 in FIG. 9 is an example of a "differential amplification step." Step S3 in FIG. 9 is an example of a "first synchronous wave-detection step." Step S4 in FIG. 9 is an example of a "physical quantity detection signal generation step." Step S5 in FIG. 9 is an example of a "adding step." Step S6 in FIG. 9 is an example of a "second synchronous wave-detection step." Step S7 in FIG. 9 is an example of a "vibration leakage signal generation step." Step S8 in FIG. 9 is an example of a "failure diagnosis step."

1-6. Operational Effects

In the physical quantity sensor 1 according to the present embodiment, the physical quantity detection device 100 outputs the first signal containing the first physical quantity component based on a detected physical quantity and the first vibration leakage component based on the vibration of the physical quantity detection device 100 and the second signal containing the second physical quantity component based on the detected physical quantity and the second vibration leakage component based on the vibration of the physical quantity detection device 100. The physical quantity detection circuit 200 includes the adder circuit 33, which adds the signal pair based on the first and second signals outputted from the physical quantity detection device 100, the synchronous wave-detection circuit 35B, which performs synchronous wave-detection on a signal based on the output signal from the adder circuit 33 and outputs a signal according to the sum of the first and second vibration leakage components, and the vibration leakage signal generation circuit that generates the vibration leakage signal QDOX based on the output signal from the synchronous wave-detection circuit 35B. Since the first and second vibration leakage components have the same phase, the adder circuit 33 amplifies the vibration leakage components. Further, for example, when part of the physical quantity detection device 100 breaks or when part of a wiring line electrically coupled to the physical quantity detection device 100 is cut and decoupled or short-circuited, the magnitude of the first or second vibration leakage component changes, and the magnitude of the vibration leakage signal QDOX changes accordingly. The physical quantity sensor 1, the physical quantity detection circuit 200, or the method for diagnosing failure of the physical quantity sensor 1 can therefore generate the vibration leakage signal QDOX usable for the failure diagnosis based on the leakage vibration that occurs at the physical quantity detection device 100.

In the physical quantity sensor 1 according to the present embodiment, the physical quantity detection circuit 200 includes the differential amplification circuit 32, which differentially amplifies the signal pair based on the first and second signals outputted from the physical quantity detection device 100, the synchronous wave-detection circuit 35A, which performs synchronous wave-detection on a signal based on the output signal from the differential amplification circuit 32 and outputs a signal according to the difference between the first and second physical quantity components, and the physical quantity detection signal generation circuit that generates the physical quantity detection signal SDOX based on the output signal from the synchronous wave-detection circuit 35A. Since the first physical quantity component contained in the first signal and the second physical quantity component contained in the second signal have opposite phases, the differential amplification circuit 32 amplifies the physical quantity components. Further, since the magnitudes of the first and second physical quantity components change in accordance with the magnitude of the physical quantity detected with the physical quantity detection device 100, the magnitude of the physical quantity detection signal SDOX changes. The physical quantity sensor 1, the physical quantity detection circuit 200, or the method for diagnosing failure of the physical quantity sensor 1 can therefore generate the physical quantity detection signal SDOX according to the physical quantity detected with the physical quantity detection device 100.

In the physical quantity sensor 1 according to the present embodiment, since the first vibration leakage component contained in the first signal and the second vibration leakage component contained in the second signal have the same phase, the differential amplification circuit 32 attenuates the vibration leakage components. Therefore, even when the phase of the wave-detection signal SDET inputted to the synchronous wave-detection circuit 35A deviates from a design value due, for example, to manufacture variation, the vibration leakage component contained in the output signal from the synchronous wave-detection circuit 35A decreases, whereby a concern of an increase in the noise component contained in the physical quantity detection signal SDOX and a concern of deviation of the zero point from a design value by an indefinite amount are suppressed. The physical quantity sensor 1, the physical quantity detection circuit 200, or the method for diagnosing failure of the physical quantity sensor 1 can therefore lower the influence of the leakage vibration on the physical quantity detection signal SDOX. In particular, when the physical quantity detection device 100 is so tuned that the amount of difference between the first and second vibration leakage components is substantially zero, the vibration leakage component contained in the output signal from the differential amplification circuit 32 is substantially zero. Therefore, even when the phase of the wave-detection signal SDET deviates from a design value, the output signal from the synchronous wave-detection circuit 35A hardly contains a vibration leakage component, so that there is hardly an influence of the leakage vibration on the physical quantity detection signal SDOX.

In the physical quantity sensor 1 according to the present embodiment, since the first physical quantity component contained in the first signal and the second physical quantity component contained in the second signal have opposite phases, the adder circuit 33 attenuates the physical quantity components. Therefore, even when the phase of the wave-detection signal QDET inputted to the synchronous wave-detection circuit 35B deviates from a design value due, for example, to manufacture variation, the physical quantity component contained in the output signal from the synchronous wave-detection circuit 35B decreases, whereby a concern of an increase in the noise component contained in the vibration leakage signal QDOX is suppressed. The physical quantity sensor 1, the physical quantity detection circuit 200, or the method for diagnosing failure of the physical quantity sensor 1 can therefore lower the influence of the detected physical quantity on the vibration leakage signal QDOX, whereby the failure diagnosis can be performed on a regular basis concurrently with the detection of the physical quantity.

In the physical quantity sensor 1 according to the present embodiment, the physical quantity detection circuit 200 includes the failure diagnosis circuit 60, which performs failure diagnosis based on the vibration leakage signal. The failure diagnosis circuit 60 then diagnoses that the state of the physical quantity sensor 1 as failure when the magnitude of the vibration leakage signal QDOX does not fall within the first range. The physical quantity sensor 1, the physical quantity detection circuit 200, or the method for diagnosing failure of the physical quantity sensor 1 can therefore reduce the processing burden on the MCU 5 because the MCU 5, which is an external apparatus, needs to perform no failure diagnosis. Further, when the first range is variable, an appropriate first range according to the magnitudes of the first and second vibration leakage components is settable, whereby a concern of wrong diagnosis performed by the failure diagnosis circuit 60 is suppressed. Further, arbitrary one of a plurality of types of physical quantity detection device 100 that provide first and second vibration leakage components having different magnitudes can be coupled to the physical quantity detection circuit 200 with no change in design of the physical quantity detection circuit 200.

1-7. Variations

For example, the physical quantity detection circuit 200 includes the failure diagnosis circuit 60 in the embodiment described above but may include no failure diagnosis circuit. For example, the MCU 5, which is an external apparatus, may diagnose failure of the physical quantity sensor 1 based on the vibration leakage signal QDOX.

In the embodiment described above, the physical quantity detection circuit 200 outputs the physical quantity detection signal SDOX and the failure diagnosis result signal QF to the MCU 5, which is an external apparatus, via the interface circuit 70 in accordance with a request from the MCU 5 and may instead output the failure diagnosis result signal QF via the interface circuit 70 independently of the physical quantity detection signal SDOX. Further, the physical quantity detection circuit 200 may output the failure diagnosis result signal QF not via the interface circuit 70 but via an external terminal.

In the embodiment described above, the physical quantity detection circuit 200 outputs the physical quantity detection signal SDOX and the vibration leakage signal QDOX, which are each a digital signal, via the interface circuit 70 and may instead output a physical quantity detection signal and a vibration leakage signal that are each an analog signal via an external terminal.

In the embodiment described above, the analog/digital conversion circuit 41 converts the physical quantity detection signal SAO into the physical quantity detection signal SDO, and the analog/digital conversion circuit 42 converts the vibration leakage signal QAO into the vibration leakage signal QDO, and one analog/digital conversion circuit may perform conversion of the physical quantity detection signal SAO into the physical quantity detection signal SDO and conversion of the vibration leakage signal QAO into the vibration leakage signal QDO in a time division manner.

In the embodiment described above, the digital signal processing circuit 51 performs predetermined computation on the physical quantity detection signal SDO to generate the physical quantity detection signal SDOX, and the digital signal processing circuit 52 performs predetermined computation on the vibration leakage signal QDO to generate the vibration leakage signal QDOX. One digital signal processing circuit may instead generate the physical quantity detection signal SDOX and the vibration leakage signal QDOX in a time division manner.

In the embodiment described above, the physical quantity sensor 1 includes the physical quantity detection device 100, which detects angular velocity as the physical quantity and may instead include a physical quantity detection device that detects a physical quantity other than angular velocity. For example, the physical quantity sensor 1 may include physical quantity detection devices that detect acceleration, angular acceleration, speed, force, and other physical quantities.

In the embodiment described above, the physical quantity sensor 1 include one physical quantity detection device and may instead include a plurality of physical quantity detection devices. For example, the physical quantity sensor 1 may include a plurality of physical quantity detection devices, and the plurality of physical quantity detection devices may each detect a physical quantity by using any one of two or more axes perpendicular to one another as a detection axis. Further, for example, the physical quantity sensor 1 may include a plurality of physical quantity detection devices, and the plurality of physical quantity detection devices may detect any one of a plurality of types of physical quantity, such as angular velocity, acceleration, angular acceleration, speed, and force. That is, the physical quantity sensor 1 may be a composite sensor.

The above embodiment has been described with reference to the case where the vibration element of the physical quantity detection device 100 is a double-T-shaped quartz crystal vibration element, and the vibration element of a physical quantity detection device that detects a variety of physical quantities may, for example, be a tuning-fork-type or comb-type vibration element or a tuning-fork-type vibration element having, for example, a triangular, quadrangular, or circular columnar shape. The vibration element of the physical quantity detection device may be made, for example, of a piezoelectric material, such as piezoelectric crystal, such as lithium tantalate ($LiTaO_3$) and lithium niobite ($LiNbO_3$), or piezoelectric ceramic, such as lead zirconate titanate (PZT), or a silicon semiconductor in place of quartz crystal ($SiO_2$). The vibration element of the physical quantity detection device may, for example, have a structure in which a piezoelectric thin film made, for example, of zinc oxide (ZnO) or aluminum nitride (AlN) and sandwiched between the drive electrodes is disposed on part of the surface of a silicon semiconductor. For example, the physical quantity detection device may be a MEMS (micro electro mechanical systems) device.

In the embodiment described above, a piezoelectric physical quantity detection device has been presented by way of example, and a physical quantity detection device that detects a variety of physical quantities is not limited to a piezoelectric device and may instead be of an electrostatic capacity type, an electro-dynamic type, an eddy current type, an optical type, a strain gauge type, and other types. The detection method employed by the physical quantity detection device is not limited to a vibration-based method and may, for example, be an optical method, a rotary method, or a fluidic method.

2. Electronic Instrument

Figure 10:
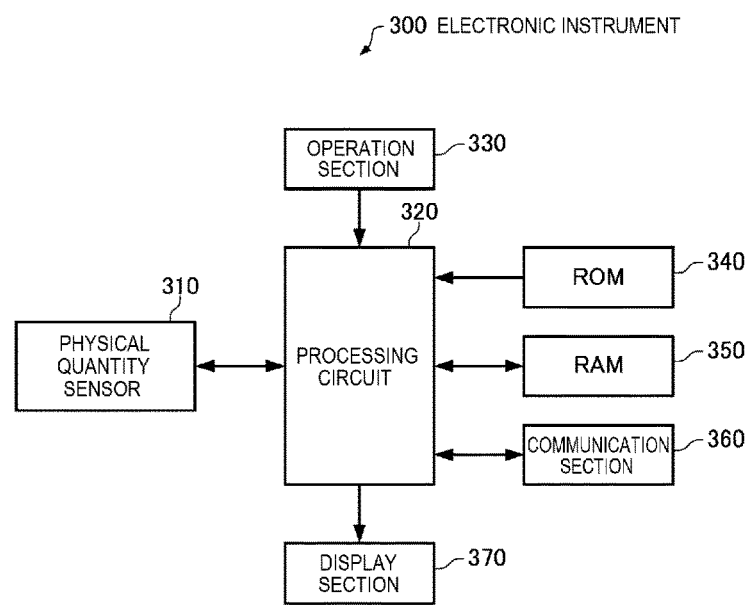
FIG. 10 is a functional block diagram showing an example of the configuration of an electronic instrument according to the present embodiment.

FIG. 10 is a functional block diagram showing an example of the configuration of an electronic instrument according to the present embodiment. An electronic instrument 300 according to the present embodiment includes a physical quantity sensor 310, a processing circuit 320, an operation section 330, a ROM (read only memory) 340, a RAM (random access memory) 350, a communication section 360, and a display section 370, as shown in FIG. 10. The electronic instrument according to the present embodiment may instead be so configured that part of the components shown in FIG. 10 is omitted or changed or another component is added to the components shown in FIG. 10.

The physical quantity sensor 310 detects a physical quantity and outputs the result of the detection to the processing circuit 320. The physical quantity sensor 1 according to the present embodiment described above can, for example, be used as the physical quantity sensor 310.

The processing circuit 320 carries out a process based on the output signal from the physical quantity sensor 310. Specifically, the processing circuit 320 communicates with the physical quantity sensor 310 and uses the output signal from the physical quantity sensor 310 to perform a variety of types of calculation and control in accordance with a program stored, for example, in the ROM 340. In addition, the processing circuit 320 carries out a variety of processes according to an operation signal from the operation section 330, the process of controlling the communication section 360 for data communication with an external apparatus, the process of transmitting a display signal for displaying a variety of pieces of information on the display section 370, and other processes.

The operation section 330 is an input apparatus formed, for example, of operation keys or button switches and outputs an operation signal according to a user's operation to the processing circuit 320.

The ROM 340 stores programs, data, and other pieces of information for the variety of types of calculation and control performed by the processing circuit 320.

The RAM 350 is used as a work area where the processing circuit 320 operates and temporarily stores the programs and data read from the ROM 340, data inputted via the operation section 330, results of computation performed by the processing circuit 320 in accordance with the variety of programs, and other pieces of information.

The communication section 360 performs a variety of types of control for establishing data communication between the processing circuit 320 and an external apparatus.

The display section 370 is a display apparatus formed, for example, of a liquid crystal display (LCD) and displays a variety of pieces of information based on the display signal inputted from the processing circuit 320. The display section 370 may be provided with a touch panel that function as the operation section 330.

Using, for example, the physical quantity sensor 1 according to the present embodiment described above as the physical quantity sensor 310 allows generation of a signal usable for the failure diagnosis based on the leakage vibration that occurs at the physical quantity detection device and reduction in the influence of the leakage vibration on the physical quantity detection signal, whereby a reliable electronic instrument can, for example, be achieved.

A variety of electronic instruments are conceivable as the electronic instrument 300. Conceivable examples of the electronic instrument 300 may include a personal computer, such as a mobile personal computer, a laptop personal computer, and a tablet personal computer; a mobile terminal, such as a smartphone and a mobile phone; a digital camera; an inkjet-type liquid ejection apparatus, such as an inkjet printer; a storage area network instrument, such as a router and a switch; a local area network instrument, an instrument for a mobile terminal base station; a television receiver; a video camcorder; a video recorder; a car navigator; a real-time clock apparatus; a pager; an electronic notepad; an electronic dictionary; a desktop calculator; an electronic game console; a game controller; a word processor; a workstation; a TV phone; a security television monitor; electronic binoculars; a POS terminal; a medical instrument, such as an electronic thermometer, a blood pressure gauge, a blood sugar meter, an electrocardiograph, an ultrasonic diagnostic apparatus, and an electronic endoscope; a fish finder; a variety of measuring instruments; a variety of meters for car, airplane, and ship; a flight simulator; a head mounted display; a motion tracer; a motion tracker; a motion controller; and a pedestrian dead reckoning (PDR) apparatus.

Figure 11:
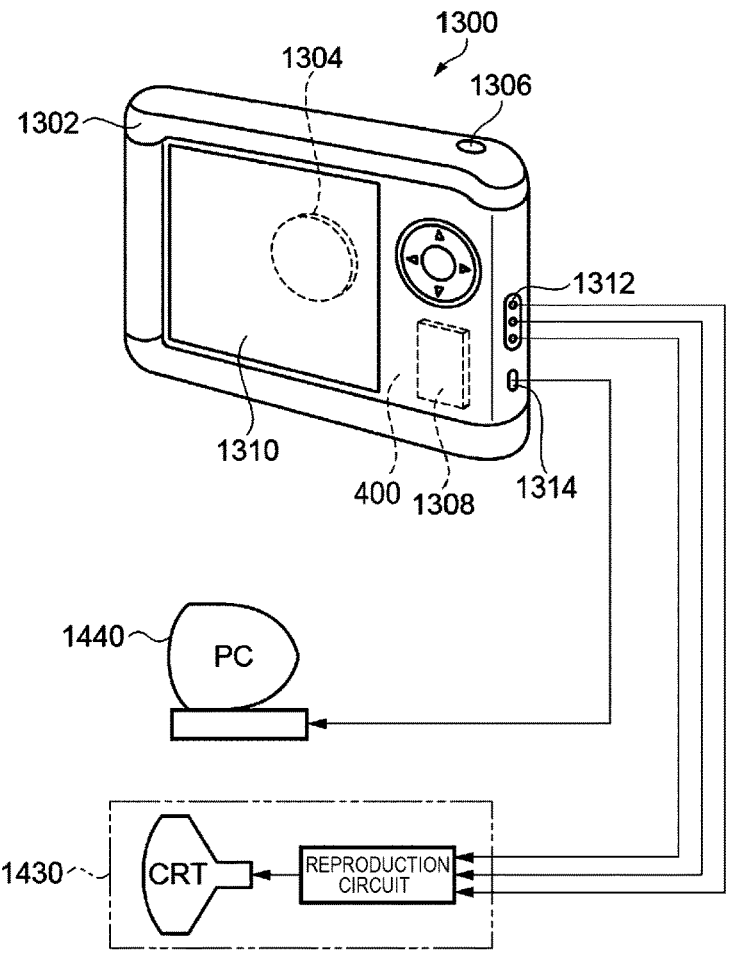
FIG. 11 is a perspective view diagrammatically showing a digital camera that is an example of the electronic instrument.

FIG. 11 is a perspective view diagrammatically showing a digital camera 1300, which is an example of the electronic instrument 300 according to the present embodiment. FIG. 11 also shows connection to an external instrument in a simplified manner. In a typical camera, a silver photographic film is exposed to light, specifically, to an optical image of a subject, whereas the digital camera 1300 converts an optical image of a subject in a photoelectric conversion process by using an imaging device, such as a charge coupled device (CCD) and generates a captured image signal.

A display section 1310 is provided on the rear surface of an enclosure 1302 of the digital camera 1300 and displays an image based on the captured image signal from the CCD. The display section 1310 thus functions as a finder that displays the subject in the form of an electronic image. Further, a light receiving unit 1304 including an optical lens, the CCD, and other components is provided on the front surface of the enclosure 1302. When a user of the camera checks the subject image displayed on the display section 1310 and presses a shutter button 1306, a captured image signal from the CCD at that point of time is transferred to and stored in a memory 1308. Further, in the digital camera 1300, a video signal output terminal 1312 and a data communication input/output terminal 1314 are provided on the side surface of the enclosure 1302. A television monitor 1430 is coupled to the video signal output terminal 1312 as necessary, and a personal computer 1440 is coupled to the data communication input/output terminal 1314 as necessary. Further, in response to predetermined operation, the captured image signal stored in the memory 1308 is outputted to the television monitor 1430 or the personal computer 1440. The digital camera 1300 includes the physical quantity sensor 310, which is, for example, an angular velocity sensor, and uses the output signal from the physical quantity sensor 310 to perform, for example, hand-shake correction.

3. Vehicle

Figure 12:
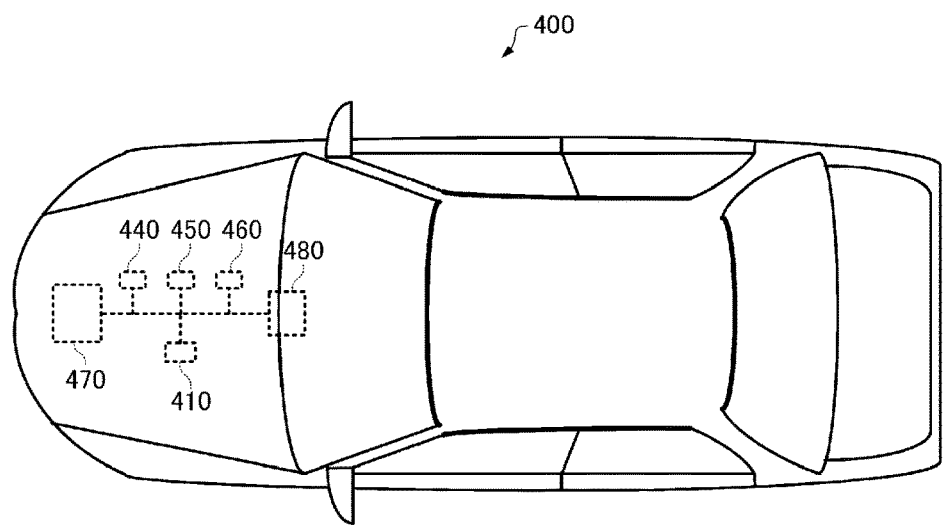
FIG. 12 shows an example of a vehicle according to the present embodiment.

FIG. 12 shows an example of a vehicle according to the present embodiment. A vehicle 400 shown in FIG. 12 includes a physical quantity sensor 410, processing circuits 440, 450, and 460, a battery 470, and a navigator 480. The vehicle according to the present embodiment may be so configured that part of the components shown in FIG. 12 is omitted or another component is added to the components shown in FIG. 12.

The physical quantity sensor 410, the processing circuits 440, 450, and 460, and the navigator 480 operate by using power supply voltage supplied from the battery 470.

The physical quantity sensor 410 detects a physical quantity and outputs the result of the detection to the processing circuits 440, 450, and 460.

The processing circuits 440, 450, and 460 carry out processes based on the output signal from the physical quantity sensor 410. For example, the processing circuits 440, 450, and 460 use the output signal from the physical quantity sensor 410 and perform a variety of types of control of an attitude control system, a rollover prevention system, a brake system, and other systems.

The navigator 480 displays the position of the vehicle 400, the time, and a variety of other pieces of information on a display based on output information from a built-in GPS receiver. The navigator 480 identifies the position and orientation of the vehicle 400 based on the output signal from the physical quantity sensor 410 even when no electric waves from GPS satellites reach the navigator 480 and keeps displaying necessary information.

Using, for example, the physical quantity sensor 1 according to the embodiment described above as the physical quantity sensor 410 allows, for example, a reliable vehicle to be achieved because a signal usable for the failure diagnosis can be generated based on the leakage vibration that occurs at the physical quantity detection device and the influence of the leakage vibration on the physical quantity detection signal can be reduced.

The thus configured vehicle 400 is conceivably any of a variety of vehicles, for example, an automobile, such as an electric automobile, an airplane, such as a jet plane and a helicopter, a ship, a rocket, and an artificial satellite.

The embodiment and the variations described above are presented by way of example, and the present disclosure is not limited thereto. For example, any of the embodiment and the variations can be combined with each other as appropriate.

The present disclosure encompasses substantially the same configuration as the configuration described in the embodiment (for example, a configuration having the same function, using the same method, and providing the same result or a configuration having the same purpose and providing the same effect). Further, the present disclosure encompasses a configuration in which an inessential portion of the configuration described in the embodiment is replaced. Moreover, the present disclosure encompasses a configuration that provides the same operational effect as that provided by the configuration described in the embodiment or a configuration that can achieve the same purpose as that achieved by the configuration described in the embodiment. Further, the present disclosure encompasses a configuration in which a known technology is added to the configuration described in the embodiment.

What is claimed is:

1. A physical quantity detection circuit that receives a first signal and a second signal outputted from a physical quantity detection device that detects a physical quantity and generates a physical quantity detection signal according to the physical quantity detected with the physical quantity detection device based on the first and second signals,
   the first signal containing a first physical quantity component based on the physical quantity detected with the physical quantity detection device and a first vibration leakage component based on vibration of the physical quantity detection device,
   the second signal containing a second physical quantity component based on the physical quantity detected with the physical quantity detection device and a second vibration leakage component based on the vibration of the physical quantity detection device,
   the first and second physical quantity components having opposite phases, and
   the first and second vibration leakage components having the same phase,
   the physical quantity detection circuit comprising:
   a differential amplification circuit that differentially amplifies a signal pair based on the first and second signals;
   an adder circuit that adds the signal pair;
   a first synchronous wave-detection circuit that performs synchronous wave-detection on a signal that is based on an output signal from the differential amplification circuit and outputs a signal according to a difference between the first physical quantity component and the second physical quantity component;
   a second synchronous wave-detection circuit that performs synchronous wave-detection on a signal that is based on an output signal from the adder circuit and outputs a signal according to a sum of the first vibration leakage component and the second vibration leakage component;
   a physical quantity detection signal generation circuit that generates the physical quantity detection signal based on an output signal from the first synchronous wave-detection circuit; and
   a vibration leakage signal generation circuit that generates a vibration leakage signal based on an output signal from the second synchronous wave-detection circuit.

2. The physical quantity detection circuit according to claim 1, wherein an amount of difference between the first vibration leakage component and the second vibration leakage component is substantially zero.

3. The physical quantity detection circuit according to claim 1, further comprising:
   a first charge amplification circuit to which the first signal is inputted; and
   a second charge amplification circuit to which the second signal is inputted,
   wherein the signal pair is formed of an output signal from the first charge amplification circuit and an output signal from the second charge amplification circuit.

4. The physical quantity detection circuit according to claim 1, further comprising a failure diagnosis circuit that performs failure diagnosis based on the vibration leakage signal.

5. The physical quantity detection circuit according to claim 4, wherein the failure diagnosis circuit diagnoses a state of the physical quantity detection circuit as failure when a magnitude of the vibration leakage signal does not fall within a first range.

6. The physical quantity detection circuit according to claim 5, wherein the first range is variable.

7. A physical quantity sensor comprising:
   the physical quantity detection circuit according to claim 1; and
   the physical quantity detection device.

8. An electronic instrument comprising:
   the physical quantity sensor according to claim 7; and
   a processing circuit that carries out a process based on an output signal from the physical quantity sensor.

9. A vehicle comprising:
   the physical quantity sensor according to claim 7; and
   a processing circuit that carries out a process based on an output signal from the physical quantity sensor.

10. A method for diagnosing failure of a physical quantity sensor including a physical quantity detection device that detects a physical quantity and outputs a first signal and a second signal and a physical quantity detection circuit that generates a physical quantity detection signal according to the physical quantity detected with the physical quantity detection device based on the first and second signals,
    the first signal containing a first physical quantity component based on the physical quantity detected with the physical quantity detection device and a first vibration leakage component based on vibration of the physical quantity detection device,
    the second signal containing a second physical quantity component based on the physical quantity detected with the physical quantity detection device and a second vibration leakage component based on the vibration of the physical quantity detection device,
    the first and second physical quantity components having opposite phases, and
    the first and second vibration leakage components having the same phase,
    the method comprising:
    a differential amplification step of differentially amplifying a signal pair based on the first and second signals outputted from the physical quantity detection device;
    an adding step of adding the signal pair;
    a first synchronous wave-detection step of performing synchronous wave-detection on a signal that is based on a signal obtained in the differential amplification step to generate a signal according to a difference between the first physical quantity component and the second physical quantity component;
    a second synchronous wave-detection step of performing synchronous wave-detection on a signal that is based on a signal obtained in the adding step to generate a signal according to a sum of the first vibration leakage component and the second vibration leakage component;
    a physical quantity detection signal generation step of generating the physical quantity detection signal based on a signal generated in the first synchronous wave-detection step;

a vibration leakage signal generation step of generating a vibration leakage signal based on a signal generated in the second synchronous wave-detection step; and a failure diagnosis step of diagnosing failure of the physical quantity sensor based on the vibration leakage signal.

11. The method for diagnosing failure of a physical quantity sensor according to claim 10, wherein an amount of difference between the first vibration leakage component and the second vibration leakage component is substantially zero.

12. The method for diagnosing failure of a physical quantity sensor according to claim 10, wherein the physical quantity detection circuit includes a first charge amplification circuit to which the first signal is inputted, and a second charge amplification circuit to which the second signal is inputted, wherein the signal pair is formed of an output signal from the first charge amplification circuit and an output signal from the second charge amplification circuit.

13. The method for diagnosing failure of a physical quantity sensor according to claim 10, wherein in the failure diagnosis step, a state of the physical quantity sensor is diagnosed as failure when a magnitude of the vibration leakage signal does not fall within a first range.

14. The method for diagnosing failure of a physical quantity sensor according to claim 13, wherein the first range is variable.

* * * * *